Figure 1:
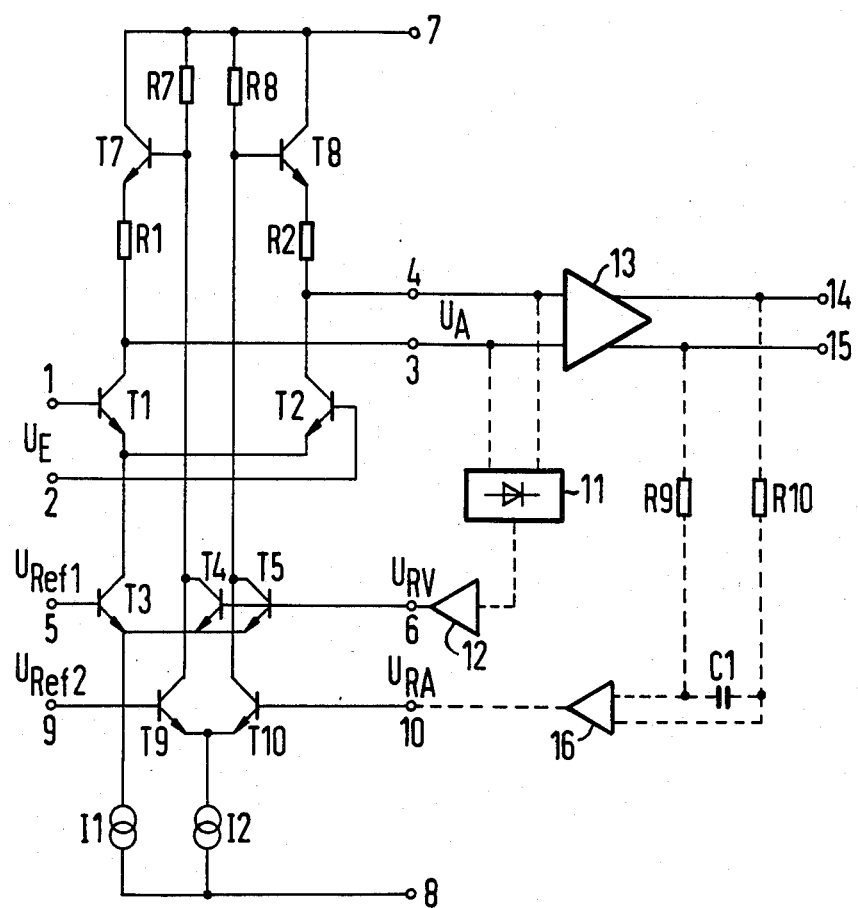

United States Patent [19]

Fenk

[11] Patent Number: 4,621,238

[45] Date of Patent: Nov. 4, 1986

[54] DIFFERENTIAL AMPLIFIER CIRCUIT HAVING CONTROLLABLE GAIN

[75] Inventor: Josef Fenk, Eching, Fed. Rep. of Germany

[73] Assignee: Siemens Aktiengesellschaft, Berlin and Munich, Fed. Rep. of Germany

[21] Appl. No.: 742,115

[22] Filed: Jun. 6, 1985

[30] Foreign Application Priority Data

Jun. 7, 1984 [DE]  Fed. Rep. of Germany ....... 3421241

[51] Int. Cl.$^4$ .......................... H03G 3/30; H03F 3/45
[52] U.S. Cl. .................................... 330/254; 330/261; 330/278
[58] Field of Search ............... 330/252, 254, 258, 259, 330/260, 261, 278, 279

[56] References Cited

U.S. PATENT DOCUMENTS

| 4,286,226 | 8/1981 | Leidich ............................. 330/254 |
| 4,360,786 | 11/1982 | Rehfeldt ........................... 330/254 |
| 4,514,702 | 4/1985 | Zogg ................................. 330/254 |

FOREIGN PATENT DOCUMENTS 3204430  8/1983  Fed. Rep. of Germany .

Primary Examiner—Eugene R. LaRoche
Assistant Examiner—Steven J. Mottola
Attorney, Agent, or Firm—Herbert L. Lerner; Laurence A. Greenberg

[57] ABSTRACT

A differential amplifier circuit includes a first differential amplifier stage formed of a pair of transistors having inputs and output circuits, the inputs of the transistor pair of the first differential amplifier stage forming an input of the amplifier circuit, load resistors having circuits connected to the output circuits of the pair of transistors of the first differential amplifier stage, a circuit output connected to the load resistors, at least two further differential amplifier stages having first and second circuits, a reference input connected to the first circuit of the further differential amplifier stages, a gain control input connected to the second circuit of the further differential amplifier stages, at least the first circuit of the further differential amplifier stages being connected to the output circuits of the pair of transistors of the first differential amplifier stage, the second circuit of the further differential amplifier stages driving the load resistor circuits, and a control stage connected to the load resistor circuits for maintaining a constant d-c voltage level in the circuit output.

14 Claims, 2 Drawing Figures

DIFFERENTIAL AMPLIFIER CIRCUIT HAVING CONTROLLABLE GAIN

The present invention relates to a differential amplifier circuit, including a first differential amplifier stage formed of a pair of transistors having inputs and output circuits, the inputs of the transistor pair of the first differential amplifier stage forming an input of the amplifier circuit, load resistors having circuits connected to the output circuits of the pair of transistors of the first differential amplifier stage, a circuit output connected to the load resistors, at least two further differential amplifier stages having first and second circuits, and a reference input connected to the first circuit of the further differential amplifier stages, a gain control input connected to the second circuit of the further differential amplifier stages, at least the first circuit of the further differential amplifier stages being connected to the output circuits of the pair of transistors of the first differential amplifier stage.

A differential amplifier circuit of this type is known from German Published, Non-Prosecuted Application DE-OS No. 32 04 430.

This relates to a differential amplifier circuit which simultaneously assures maximum signal gain and a large dynamic range up to the UHF range. The circuit is configured in such a way that the differential amplifier stage receiving the input signal as well as further differential amplifier stages driven by an amplification control signal work into common output nodes and thus stabilize the operating point. In this case, the output nodes are decoupled from the output by cascode stages connected thereto.

However, in such a device either undesired feedbacks are still obtained in the signal path, or it is necessary to use multi-emitter transistors which are not optimum especially for high-frequency amplifiers. In addition, the above-mentioned cascode stages cause undesirable phase shifts.

It is accordingly an object of the invention to provide a differential amplifier stage which overcomes the hereinafore-mentioned disadvantages of the heretofore-known devices of this general type, and which allows the operating points of amplifier outputs to be set outside the signal path of the amplifier, independently of the operating point and the gain.

With the foregoing and other objects in view there is provided, in accordance with the invention, a differential amplifier circuit, comprising a first differential amplifier stage formed of a pair of transistors having inputs and output circuits, the inputs of the transistor pair of the first differential amplifier stage forming an input of the amplifier circuit, load resistors having circuits connected to the output circuits of the pair of transistors of the first differential amplifier stage, a circuit output connected to the load resistors, at least two further differential amplifier stages having first and second circuits, a reference input connected to the first circuit of the further differential amplifier stages, a gain control input connected to the second circuit of the further differential amplifier stages, at least the first circuit of the further differential amplifier stages being connected to the output circuits of the pair of transistors of the first differential amplifier stage, the second circuits of the further differential amplifier stages driving a control stage connected to the load resistor circuits for maintaining a constant d-c voltage level in the circuit output.

In accordance with another feature of the invention, the pair of transistors of the first differential amplifier stage have emitter electrodes connected to each other, the further differential amplifier stages have a common transistor connected to the reference input and to the interconnected emitter electrodes of the pair of transistors of the first differential amplifier stage, and the further differential amplifier stages have another transistor connected to the gain control input.

In accordance with a further feature of the invention, the further differential amplifier stages have transistors being connected to the gain control input and having output circuitry, the control stage includes two control transistor branches and two resistance branches, the control transistor branches including control transistors each having an output circuit connected to a circuit of a respective one of the load resistors and each having an input, the resistance branches including resistors each being connected to a junction point connected to the output circuit of a respective one of the transistors of the further differential amplifier stages connected to the gain control input and to a respective one of the inputs of the control transistors.

In accordance with an added feature of the invention, there is provided a rectifier and a control amplifier connected between the circuit output and the gain control input.

In accordance with an additional feature of the invention, the further differential amplifier stages have transistors being connected to the control input and having output circuits, and including another differential amplifier stage for controlling an operating point having a pair of transistors with inputs and with output circuits connected in parallel with the output circuits of the transistors of the further differential amplifier stages connected to the control input, a further reference input connected to the input of one of the transistors of the other differential amplifier stage, and an operating point control input connected to the input of the other of the transistors of the other differential amplifier stage.

In accordance with again another feature of the invention, the circuit output is connected to the operating point control input.

In accordance with again a further feature of the invention, the further differential amplifier stages each include a first transistor being connected to the reference input and having an output circuit and a second transistor being connected to the gain control input and having an output circuit, the output circuits of the first transistors being connected in series between the load resistors and the output circuits of the transistors of the first differential amplifier stage, and the output circuits of the second transistors being connected in series with the output circuits of the transistors of the first differential amplifier stage.

In accordance with again an added feature of the invention, the transistors of the further differential amplifier stages connected to the gain control input have collector electrodes connected to each other, and the control stage includes a control transistor branch and two resistor branches, the control transistor branch having a control transistor having an input and having an output circuit connected to the circuit of the load resistors, and the resistor branches being connected in parallel with each other and in series with the interconnected collector electrodes at a junction point additionally connected to the input of the control transistor.

In accordance with again an additional feature, there is provided another resistor connected between the emitter electrodes of the transistors of the first differential amplifier stage.

In accordance with yet another feature of the invention, there is provided another differential amplifier stage having outputs and being connected between the corresponding transistors of the further differential amplifier stages and the reference input and gain control input, respectively, and including a diode-resistance chain connected to the outputs of the other differential amplifier stage for setting equal d-c voltage levels.

In accordance with a concomitant feature of the invention, the resistors of the control stage are equal to each other and to the load resistors.

Other features which are considered as characteristic for the invention are set forth in the appended claims.

Although the invention is illustrated and described herein as embodied in a differential amplifier circuit, it is nevertheless not intended to be limited to the details shown, since various modifications and structural changes may be made therein without departing from the spirit of the invention and within the scope and range of equivalents of the claims.

Figure 2:
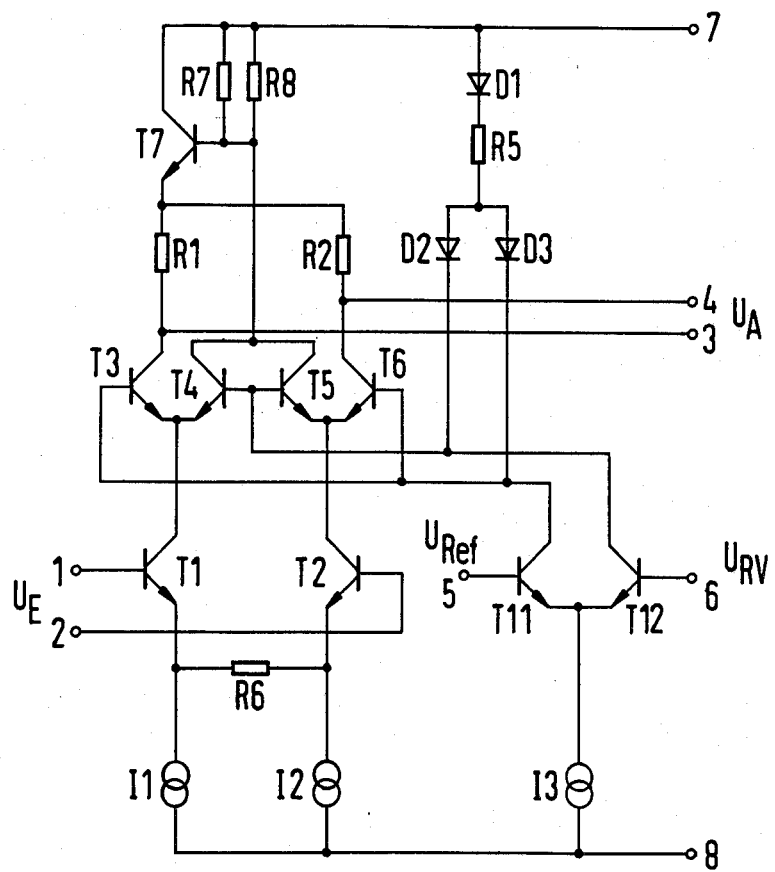

The construction and method of operation of the invention, however, together with additional objects and advantages thereof will be best understood from the following description of specific embodiments when read in connection with the accompanying drawings, in which:

FIG. 1 is a schematic circuit diagram of a first embodiment of a differential amplifier circuit according to the invention; and FIG. 2 is a schematic circuit diagram of a further embodiment of a differential amplifier circuit according to the invention.

Referring now to the figures of the drawings in detail and first, particularly, to FIG. 1 thereof, there is seen a differential amplifier circuit which has a first differential amplifier stage formed by transistors T1 and T2. The first stage has inputs 1 and 2 which form a symmetrical circuit input and which receive an input signal $U_E$. Load resistors R1 and R2 are connected in the output circuits of the transistors T1 and T2, i.e. in their collector branches. An output signal of the differential amplifier circuit can be taken off at the output circuits. The junction points between the load resistors R1 and R2 and the collectors of the transistors T1 and T2 thus form an output 3, 4 of the differential amplifier circuit, at which the output signal designated with reference symbol $U_A$ can be taken off.

The differential amplifier circuit also includes differential amplifier stages which are formed by transistirs T3, T4 and T3, T5, respectively. These other differential amplifier stages are connected in such a manner that the output circuit of transistor T3, i.e., its collector-emitter path, is tied to the emitters of the transsistors T1 and T2 which are directly connected to each other. The output circuits of the transistors T4 and T5, i.e., their collectoremitter paths, are coupled to a control stage connected into the circuit of the load resistors R1 and R2, in a manner to be described in greater detail below. The emitters of the transistors T3 to T5 are connected directly to each other as is customary in differential amplifier stages, and they are fed from a current source I1.

On the other hand, it is also possible to couple the emitters of the above-mentioned differential stages through resistors in order to fix the length of the input characteristics of these differential amplifier stages.

The above-mentioned differential amplifier stages T3 and T5 are connected into a gain control circuit which is formed by a rectifier 11 connected to the output 3, 4 and an amplitude control amplifier 12. A gain control signal $U_{RV}$ is fed to the bases of the transistors T4 and T5 from a terminal 6 at the output of the amplifier 12. A reference signal $U_{Ref\,1}$ for the gain control is fed to a terminal 5 at the base of the transistor T3.

The differential amplifier circuit also includes a differential amplifier stage with transistors T9 and T10 which serves for controlling the operating point. The emitters of the transistors T9, T10 are connected to each other and are supplied from a current source I2. The output circuits, i.e., the collector-emitter paths of transistors T9 and T10 of this differential amplifier stage, are connected in parallel to the output circuits of the transistors T4 and T5 of the differential amplifier stages for the gain control.

The last-mentioned differential amplifier stage formed by the transistors T9 and T10 is connected into an operating point control circuit which is formed by a follower amplifier 13 connected to the output 3, 4, a lowpass filter R9, R10, C1 connected to the output of the amplifier 13, as well as an operating point control amplifier 16.

An operating point control signal $U_{RA}$ is fed to the base of the transistor T10 from a terminal 10 at the output of this amplifier 16. A reference signal $U_{Ref\,2}$ is fed to a terminal 9 at the base of the transistor T9. The further amplified output signal $U_A$ of the output 3, 4 of the differential amplifier circuit can be taken off at an output 14, 15 of the follower amplifier 13.

The differential amplifier circuit is supplied with a supply voltage at terminals 7 and 8. Customarily, terminal 7 is at the supply potential and terminal 8 is at a reference potential such as ground. If transistors of a different conduction or conductivity type are used in the differential amplifier circuit, the potential conditions are naturally reversed.

According to the invention, a control stage formed by transistors T7, T8 as well as resistors R7 and R8 is connected into the circuit of the load resistors R1 and R2. Specifically, the output circuits of the transistors T7 and T8, i.e., their collector-emitter paths, are connected in series with the load resistors R1 and R2, while the resistors R7 and R8 are connected into the output circuits, i.e., the collector-emitter paths of the transistors T4, T5 and T9, T10 of the gain control differential amplifier stages and the operating point control differential amplifier stage, respectively. The junction points between the collectors of the transistors T4, T5 as well as T9, T10 and the resistors R7 and R8, are connected to the bases of the transistors T7 and T8. On the side of the transistors T7, T8 facing away from the load resisrors R1 and R2, the collectors of the transistors T7 and T8 as well as leads of the resistors R7 and R8 are connected to the supply voltage terminal 7.

The differential amplifier circuit described above is particularly well suited for high-frequency amplification into the UHF range, since only the differential amplifier stage T1, T2 is connected between the input 1, 2 and the output 3, 4, and the signal paths are therefore short.

For maximum gain, i.e., if the base potential of the transistors T4 and T5 is more negative than the base potential of transistor T3, the entire current of the current source I1 flows through the collector-emitter path of transistor T3 into the emitters of the differential amplifier stage T1, T2. The amplified input signal $U_E$ is connected to the collectors of transistors T1 and T2 and the corresponding load resistors R1 and R2. The potential at the output 3, 4 relative to reference potential is then given by the following relationships:

$$U_{3/8Vmax} = U_7 - R7\left(\frac{I1}{2 \cdot B_7} + \frac{I2}{2}\right) - U_{be7} - R1 \cdot \frac{I1}{2}$$

$$U_{4/8Vmax} = U_7 - R8\left(\frac{I1}{2 \cdot B_8} + \frac{I2}{2}\right) - U_{be8} - R2 \cdot \frac{I1}{2}$$

wherein:
$U_7$ is the supply potential at the terminal 7;
I1 is the current flowing from the current source I1 into the differential amplifier stage T1, T2;
I2 is the current flowing from the current source I2 through the operating point control differential amplifier stage T9, T10 into the control stage;
B7, B8 are the current gains of transistors T7 and T8, respectively; and
$U_{be7}$, $U_{be8}$ are the base-emitter threshold voltages of transistors T7 and T8, respectively.

At minimum gain, the base potential at the transistors T4 and T5 is more positive than the base potential at the transistor T3 so that the entire current of the current source I1 then flows through the emitter-collector paths of the transistors T4 and T5 into the resistors R7 and R8 of the control stage. The resistors R7 and R8 are, in particular equal to each other and equal to the load resistors R1 and R2. The potential at the output 3, 4 relative to the reference potential is then given by the following relationships:

$$U_{3/8Vmin} = U_7 - R7\left(\frac{I1}{2} + \frac{I2}{2}\right) - U_{be7}$$

$$U_{4/8Vmin} = U_7 - R8\left(\frac{I1}{2} + \frac{I2}{2}\right) - U_{be8}$$

It can be seen from the equations given above that, for maximum gain, the potential at the output 3, 4 is smaller than with minimum gain by the quantity:

$$\Delta U_{3(4)/8Vmax} = R7(8) \cdot \frac{I1}{2 \cdot B_{7(8)}}.$$

Since the current gains $B_7$, $B_8$ are very large, this deviation is negligibly small, i.e., the d-c level at the output 3, 4 is practically constant.

The static offset at the terminals 14 and 15 can be adjusted to minimum values, through the operating point control already explained above by means of the operating point control signal $U_{RA}$ at the terminal 10.

The advantage of the amplifier circuit explained above is substantially that through the control stage T7, T8; R7, R8, intervention into the d-c voltage circuit by the differential amplifier stage T1 and T2 as well as the load resistors R1 and R2, only takes place in order to provide the respective gain and operating point adjustment. The high-frequency signal path can be optimized in this case with respect to parasitic elements.

In the embodiment of a differential amplifier circuit shown in FIG. 2, elements which are like those in the circuit according to FIG. 1 are designated with the same reference symbols, so that only the differences as compared to the embodiment according to FIG. 1 are discussed in the description of this embodiment.

In the embodiment according to FIG. 2, the coupling of the transistors T1 and T2 of the differential amplifier stage receiving the input signal $U_E$ at the input 1, 2 is provided at the emitters of the transistors through a resistor R6. A current is fed to the emitters of these transistors through current sources I1 and I2.

The differential amplifier stages provided for the gain control in the present embodiment are formed by respective differential amplifiers T3, T4; T5, T6. The emitters of the amplifiers are tied together and are connected to the output circuit, i.e., to the collectors of the transistors T1, T2. The transistors T4 and T5 are directly connected to their collectors, the common junction point being connected to the control stage yet to be explained.

The control stage is formed in this embodiment by a transistor T7 as well as resistors R7 and R8, the transistor T7 being connected with its output circuit, i.e., its collector-emitter path, connected in series between the supply voltage terminal 7 and the load resistor R1. The resistors R7 and R8 are connected parallel to each other between the supply voltage terminal 7 and the collectors of the transistors T4 and T5 which are connected to each other. The junction point between the leads of the resistors R7 and R8 which face away from the supply voltage terminal 7 and the collectors of the transistors T4 and T5, is connected to the base of the transistor T7.

The output 3, 4 of the differential amplifier circuit is formed by the junction points of the load resistors R1 and R2 and the collectors of the transistors T3 and T6; the leads of the resistors R1 and R2 facing away from the collectors of the transistors T3 and T6 are connected to each other and to the emitter of the transistor T7.

The terminal 6, at which the gain control signal or variable $U_{RV}$ is fed in the sense of a negative feedback from the output 3, 4 of the differential amplifier circuit, is connected to one input of a differential amplifier stage T11, T12. The emitters of the amplifier stage T11, T12 are fed from a current source I3. A reference voltage $U_{Ref}$ is fed into the other input which is the base of the transistor T11 at the terminal 5. The collectors of the transistors T11 and T12 of this differential amplifier stage are brought to the bases of the transistors T3, T6 and to the interconnected bases of the transistors T4, T5, respectively.

In order to set the same d-c voltage levels at the outputs of the differential amplifier stage T11, T12, the collectors of the transistors of the stage T11, T12 are connected to the supply voltage terminal 7 through a diode-resistor chain D1, D2, D3, R5.

The differential amplifier described above is formed in principle by the symmetrical signal input 1, 2 at the bases of the differential amplifier transistors T1, T2. The emitters of the transistors T1, T2 are supplied from the current sources I1, I2 and the length of the input characteristic of this differential amplifier stage is determined by the resistor R6. Since the respective collectors of the transistors T1 and T2 are connected to the emitters of the differential amplifier stages T3, T4 and T5, T6, respectively, the base potential of the transistors T4, T5 is more negative with maximum gain than the base potential of the transistors T3, T6, since the potential at the amplifier control signal 6 of the differential amplifier stage T11, T12 is more positive than at the terminal 5 for feeding-in the reference signal $U_{Ref}$. The signal current then flows through the collectors of the transistor T3 and the transistor T6 and through the load resistors R1 or R2, respectively. A symmetrical output signal $U_A$ is taken off at the output 3, 4.

If the base potential of the transistors T4, T5 becomes more positive than the base potential of the transistors T3 and T6 for the case of minimum gain, and the control signal $U_{RV}$ at the terminal 6 is more negative than the reference signal $U_{Ref}$ at the terminal 5, then the summed-up d-c and a-c current flows through the collectors of the transistors T4 and T5 into the resistors R7 and R8 of the control stage.

It is essential that the current summed up at the collectors of the transistors T4 and T5 causes the same voltage drop at the parallel-connected resistors R7 and R8 of the control stage, which occurs at the load-resistors R1 and R2 for maximum gain. This voltage drop travels to the output 3, 4 through the base-emitter path of the transistor T7 and the load resistors R1 and R2. It is again assumed in this case that the resistors R1, R2 as well as the resistors R7 and R8 have the same resistance value. The potential at the output 3, 4 is therefore practically constant, independently of the gain control. For maximum gain, the potential of the output 3, 4 is obtained from the following relationship:

$$U_{3(4)/8Vmax} = U_7 - \left(\frac{R7 \cdot R8}{R7 + R8}\right) \cdot \left(\frac{I1 + I2}{B_7}\right) - U_{be7} - I1(2) \cdot R1(2)$$

wherein, besides the quantities already explained above, the following also applies:

$B_7$ is the current gain of the transistor T7; and
$U_{be7}$ is the base-transmitter threshold of the transistor, T7.

For minimum gain, the potential at the output 3, 4 is obtained according to the following relationship:

$$U_{3(4)/8Vmin} = U_7 - \left(\frac{R7 \cdot R8}{R7 + R8}\right) \cdot (I1 + I2) - U_{be7}$$

With maximum gain, the potential at the output 3, 4 is smaller than with minimum gain by the voltage value:

$$\Delta U_{3(4)/8} = \frac{R7 \cdot R8}{R7 + R8} \cdot \frac{I1 + I2}{B_7}.$$

The foregoing is a description corresponding in substance to German application No. P 34 21 241.8, filed June 7, 1984, the International priority of which is being claimed for the instant application, and which is hereby made part of this application. Any material discrepancies between the foregoing specification and the aforementioned corresponding German application are to be resolved in favor of the latter.

I claim:

1. Differential amplifier circuit, comprising a first differential amplifier stage formed of a pair of transistors having inputs and output circuits, said inputs of said transistor pair of said first differential amplifier stage forming an input of the amplifier circuit, load resistors having circuits connected to said output circuits of said pair of transistors of said first differential amplifier stage, a circuit output connected to said load resistors, at least two further differential amplifier stages having first and second circuits, a reference input connected to said first circuits of said further differential amplifier stages, a gain control input connected to said second circuits of said further differential amplifier stages, at least said first circuits of said further differential amplifier stages being connected to said output circuits of said pair of transistors of said first differential amplifier stage, said second circuits of said further differential amplifier stages driving a control stage connected to said load resistor circuits for maintaining a constant d-c voltage level in said circuit output.

2. Differential amplifier circuit according to claim 1, wherein said pair of transistors of said first differential amplifier stage have emitter electrodes connected to each other, said further differential amplifier stages have a common transistor connected to said reference input and to said interconnected emitter electrodes of said pair of transistors of said first differential amplifier stage, and said further differential amplifier stages have further two transistors connected to said gain control input.

3. Differential amplifier circuit according to claim 1, wherein said further differential amplifier stages have transistors being connected to said gain control input and having output circuits, said control stage includes two control transistor branches and two resistance branches, said control transistor branches including control transistors each having an output circuit connected to a circuit of a respective one of said load resistors and each having an input, said resistance branches including resistors each being connected to a junction point connected to said output circuit of a respective one of said transistors of said further differential amplifier stages connected to said gain control input and to a respective one of said inputs of said control transistors.

4. Differential amplifier circuit according to claim 1, including a rectifier and a control amplifier connected between said circuit output and said gain control input.

5. Differential amplifier circuit according to claim 1, wherein said further differential amplifier stages have transistors being connected to said gain control input and having output circuits, and including another differential amplifier stage for controlling an operating point having a pair of transistors with inputs and with output circuits connected in parallel with said output circuits of said transistors of said further differential amplifier stages connected to said gain control input, a further reference input connected to said input of one of said transistors of said other differential amplifier stage, and an operating point control input connected to said input of the other of said transistors of said other differential amplifier stage.

6. Differential amplifier circuit according to claim 5, wherein said circuit output is connected to said operating point control input.

7. Differential amplifier circuit according to claim 1, wherein said further differential amplifier stages each include a first transistor being connected to said reference input and having an output circuit and a second transistor being connected to said gain control input and having an output circuit, said output circuits of said first transistors being connected in series between said load resistors and said output circuits of said transistors of said first differential amplifier stage, and said output circuits of said second transistors being connected in series with said output circuits of said transistors of said first differential amplifier stage.

8. Differential amplifier circuit according to claim 7, wherein said control stage includes two control transistor branches and two resistance branches, said control transistor branches including control transistors each having an output circuit connected to a circuit of a respective one of said load resistors and each having an input, said resistance branches including resistors each being connected to a junction point connected to said output circuit of a respective one of said transistors of said further differential amplifier stages connected to said gain control input and to a respective one of said inputs of said control transistors.

9. Differential amplifier circuit according to claim 7, wherein said transistors of said further differential amplifier stages connected to said gain control input have collector electrodes connected to each other, and said control stage includes a control transistor branch and two resistor branches, said control transistor branch having a control transistor having an input and having an output circuit connected to said circuit of said load resistors, and said resistor branches being connected in parallel with each other, and in series with said interconnected collector electrodes at a junction point additionally connected to said input of said control transistor.

10. Differential amplifier circuit according to claim 7, including another resistor connected between the emitter electrodes of said transistors of said first differential amplifier stage.

11. Differential amplifier circuit according to claim 7, including another differential amplifier stage having outputs and being connected between said transistors of said further differential amplifier stages and said reference input and gain control input, respectively, and including a diode-resistance chain connected to said outputs of said other differential amplifier stage for setting equal d-c voltage levels.

12. Differential amplifier circuit according to claim 3, wherein said resistors of said control stage are equal to each other and to said load resistors.

13. Differential amplifier circuit according to claim 8, wherein said resistors of said control stage are equal to each other and to said load resistors.

14. Differential amplifier circuit according to claim 9, wherein said resistors of said control stage are equal to each other and to said load resistors.

* * * * *